(12) United States Patent
Ghyselen et al.

(10) Patent No.: US 7,378,729 B2
(45) Date of Patent: May 27, 2008

(54) RECYCLING A WAFER COMPRISING A BUFFER LAYER, AFTER HAVING SEPARATED A THIN LAYER THEREFROM

(75) Inventors: Bruno Ghyselen, Seyssinet-Pariset (FR); Cécile Aulnette, Grenoble (FR); Bénédite Osternaud, Saint Egreve (FR); Yves-Mathieu Le Vaillant, Crolles (FR); Takeshi Akatsu, Saint Nazaire les Eymes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 426 days.

(21) Appl. No.: 11/285,008

(22) Filed: Nov. 23, 2005

(65) Prior Publication Data
US 2006/0076578 A1 Apr. 13, 2006

Related U.S. Application Data

(60) Division of application No. 10/764,289, filed on Jan. 23, 2004, now Pat. No. 7,008,857, which is a continuation of application No. PCT/IB03/04143, filed on Aug. 26, 2003.

(60) Provisional application No. 60/431,928, filed on Dec. 9, 2002.

(30) Foreign Application Priority Data
Aug. 26, 2002 (FR) .................................. 02 10587

(51) Int. Cl.
*H01L 23/12* (2006.01)

(52) U.S. Cl. .............................. 257/700; 257/E21.211; 257/E21.568; 438/455; 438/458; 438/761
(58) Field of Classification Search ................ 438/406, 438/761, 455–458; 257/E21.211, E21.568
See application file for complete search history.

(56) References Cited

U.S. PATENT DOCUMENTS 5,854,123 A 12/1998 Sato et al. .................. 438/507
5,882,987 A 3/1999 Srikrishnan ................. 438/458

(Continued)

FOREIGN PATENT DOCUMENTS

EP 0 849 788 A2 6/1998

(Continued)

OTHER PUBLICATIONS

L.J. Huang et al., "SiGe-on-insulator prepared by wafer bonding and layer transfer for high-performance field-effect transistors," Applied Physics Letters, vol. 78, No. 9 (2001) 1267-1269.

(Continued)

*Primary Examiner*—Dung A. Le
(74) *Attorney, Agent, or Firm*—Winston & Strawn LLP

(57) ABSTRACT

A donor wafer resulting from a method of recycling the wafer after detaching at least one useful layer. The donor wafer includes a substrate; a buffer structure on the substrate; a protective layer associated with the buffer structure; and a post detachment layer located above the buffer structure and presenting projections or rough portions on its surface. The protective layer prevents removal of the entire buffer structure when the post detachment layer is removed.

20 Claims, 4 Drawing Sheets

U.S. PATENT DOCUMENTS

| | | |
|---|---|---|
| 5,966,620 A | 10/1999 | Sakaguchi et al. .......... 438/455 |
| 6,143,628 A | 11/2000 | Sato et al. .................. 438/455 |
| 6,146,979 A | 11/2000 | Henley et al. .............. 438/458 |
| 6,159,824 A | 12/2000 | Henley et al. .............. 438/455 |
| 6,284,628 B1 | 9/2001 | Kuwahara et al. .......... 438/459 |
| 6,306,729 B1 | 10/2001 | Sakaguchi et al. .......... 438/458 |
| 6,326,279 B1 | 12/2001 | Kakizaki et al. ............ 438/406 |
| 6,375,738 B1 | 4/2002 | Sato ............................ 117/89 |
| 6,468,923 B1 | 10/2002 | Yonehara et al. ........... 438/761 |
| 6,818,530 B2 * | 11/2004 | Shimoda et al. ............ 438/455 |
| 2001/0003269 A1 | 6/2001 | Wu et al. ..................... 117/94 |
| 2001/0029072 A1 | 10/2001 | Kuwahara et al. .......... 438/151 |
| 2002/0068419 A1 | 6/2002 | Sakaguchi et al. .......... 438/458 |
| 2002/0072130 A1 | 6/2002 | Cheng et al. ................. 438/10 |
| 2003/0124815 A1 | 7/2003 | Henley et al. .............. 438/460 |
| 2003/0159644 A1 | 8/2003 | Yonehara et al. ............... 117/8 |
| 2004/0006311 A1 | 1/2004 | Shchervinsky ......... 604/164.01 |

FOREIGN PATENT DOCUMENTS

| | | |
|---|---|---|
| EP | 0 926 709 A2 | 6/1999 |
| EP | 0 955 671 A1 | 11/1999 |
| EP | 1 006 567 A2 | 6/2000 |
| EP | 1 039 513 A2 | 9/2000 |
| WO | WO 99/53539 A1 | 10/1999 |
| WO | WO 01/11930 A2 | 2/2001 |

OTHER PUBLICATIONS

Q.Y. Tong et al., Extracts of "Semi-conductor on wafer bonding," Science and Technology, John Wiley & Sons, Inc., Date is unknown.

* cited by examiner

RECYCLING A WAFER COMPRISING A BUFFER LAYER, AFTER HAVING SEPARATED A THIN LAYER THEREFROM

CROSS-REFERENCE TO RELATED APPLICATIONS

This application is a divisional of application Ser. No. 10/764,289 filed Jan. 23, 2004, now U.S. Pat. No. 7,008,857, which application is a continuation of International application PCT/IB2003/004143 filed Aug. 26, 2003, and claims the benefit of U.S. provisional application 60/431,928 filed Dec. 9, 2002.

BACKGROUND

1. Field of the Invention

The present invention relates to recycling of a donor wafer having a buffer layer after having transferred a thin semiconductor layer from the donor wafer to a receiving substrate.

2. Background of the Invention

The term "buffer layer" generally refers to a transition layer between a first crystalline structure such as a substrate and a second crystalline structure that has the primary function of modifying properties of the material, such as structural or stoichiometric properties or atomic surface recombination properties.

For a buffer layer, the atomic surface recombination properties may make it possible to obtain a second crystalline structure that has a lattice parameter of that differs substantially from that of the substrate. To this end, the buffer layer may have a composition which varies gradually with thickness, the gradual variation of components of the buffer layer being directly associated with a gradual variation of its lattice parameter.

The buffer layer may also have a more complex form such as a variation in composition with a variable rate, a sign inversion of the rate or discontinuous jumps in composition, possibly completed with a constant composition layer for containing defects.

A metamorphic embodiment of a buffer layer is also possible, such as a metamorphic epitaxy.

A layer or a superposition of layers produced on the buffer layer may be removed from the donor wafer in order to be transferred to a receiving substrate, in order to produce a particular structure.

A major application of transferring thin layers formed on a buffer layer relates to the formation of strained silicon layers. A material is "strained" in tension or in compression if its lattice parameter in the interface plane is greater or less than its nominal lattice parameter, respectively. Alternatively, a layer is made of a "relaxed" material if its lattice parameter in the interface plane is substantially close to its nominal lattice parameter.

When a layer of silicon is strained in tension, some properties, such as the electron mobility of the material, are improved. Other materials such as SiGe may also be subjected to such an operation.

The transfer of layers such as these onto a receiving substrate may be achieved, for example, by the so-called SMART-CUT® process. Such processes make it possible to produce structures such as SOI (Semiconductor On Insulator) structures.

For example, after detaching a layer of relaxed SiGe from a donor wafer, the structure obtained may then act as a support for growing silicon. Since the nominal lattice parameter of SiGe (which depends on the germanium content) is greater than the nominal lattice parameter of silicon, growth of silicon on the SGOI (Silicon-Germanium On Insulator) pseudo-substrate obtained makes it possible to strain the silicon layer in tension.

An example of using such a process to produce a Si/SGOI structure is described in the IBM document by L. J. Huang et al. entitled "SiGe-On-Insulator prepared by wafer bonding and layer transfer for high-performance field-effect transistors", Applied Physics Letters, 26 Feb. 2001 vol. 78, No. 9, incorporated herein by reference. Other applications of metamorphic growth are possible, especially with semiconductors of the III-V family.

Transistors are commonly produced using GaAs-based or InP-based technologies. Generally, electron mobility is higher in InP materials than in GaAs materials. By combining an InP layer and an InGaAs or InAlAs layer, it is possible to improve electron mobility in the material even further.

However, the ability to economically produce and market components using InP technology is limited. Using GaAs technology can be expensive and material availability is sometimes problematic. Also, these materials suffer from mechanical weakness and small sizes. For example, the maximum diameter obtainable for a InP wafer is typically about 4 inches compared with 6 inches for GaAs.

One possible solution to this problem may be found with reference to the receiving substrate. For example, an InP layer may be detached and obtained by metamorphic epitaxy of a buffer layer on a GaAs substrate. However, the metamorphic production technique is complex.

Certain detachment processes, such as a process of the "etch-back" type, generally lead to destruction of the remaining part of the substrate and of the buffer layer during detachment. In some other detachment processes, such as a SMART-CUT® process, the substrate is recycled but the buffer layer is lost. Optimizing and producing such a buffer layer may therefore involve a lengthy, difficult and expensive implementation.

Moreover, internal strains due to the variations in composition may cause the appearance of a high rate of crystalline defects, such as dislocations and point defects. These internal strains, and therefore the generation of defects, may be minimized by increasing the thickness over which the lattice parameter varies. It is mainly for this reason that buffer layers are usually thick, with a typical thickness ranging from one to a few micrometers. The thickness of the buffer layer is further restrained by economic considerations and, at times, certain structural complexities.

Thus there remains a need in the art for a more economical and practical technique for detaching layers of semiconductor material, and this is now provided by the present invention.

SUMMARY OF THE INVENTION

The invention relates to a method of recycling a donor wafer after detachment of a useful layer of a semiconductor material therefrom, wherein the donor wafer, after detachment of the useful layer, includes a substrate, a buffer structure on the substrate and a remaining portion of the useful layer. This method comprises removing at least part of the remaining portion of the useful layer in order to provide a donor wafer surface that is suitable for use in a subsequent detachment of a useful layer.

Advantageously, the remaining portion of the useful layer is removed chemically, and preferably by selective chemical etching. The selective chemical etching can include at least one etching fluid having an etching power which is substantially greater for the useful layer than for the buffer structure, so that the buffer structure acts as an etching stop layer for the at least one etching fluid. If desired, the chemical etching can be preceded, followed or both preceded and followed by a mechanical eroding of the wafer surface, such as by polishing, grinding or abrasion.

In one embodiment, before detachment, the buffer structure includes a buffer layer and an additional layer that has (a) a thickness which is sufficient to contain defects therein or (b) a surface lattice parameter which is substantially different from that of the substrate. Thus, the mechanical removing includes removing all of the remaining portion of the useful layer and part of the additional layer or all of the additional layer and part of the buffer layer. Also, at least one new layer can be provided on the donor wafer after mechanically removing at least part of the remaining portion of the useful layer so as to form a new useful layer or new buffer structure above the existing buffer structure. This new layer can be an overlayer which includes the useful layer to be detached, and in this case the mechanical removing removes any portion of the overlayer that remains after detachment. Preferred overlayers include (a) a material selected from the group consisting of SiGe and strained Si; (b) a material selected from the group consisting of AsGa and Ge; or (c) InP or another alloy of Group III-V elements.

In another embodiment, the method further comprises providing at least two new layers on the donor wafer after mechanically removing at least part of the remaining portion of the useful layer so as to form an interlayer between the buffer structure and the new useful layer, with the interlayer optionally being provided by layer growth. Preferred interlayers include (a) a material selected from the group consisting of SiGe and strained Si; (b) a material selected from the group consisting of AsGa and/or Ge; (c) an alloy of Group III-V elements; or (d) a material selected from the group consisting of InP and a Group III-V material having a lattice parameter substantially identical to that of InP. The buffer structure may have a composition that includes an atomic alloy of binary, ternary, quaternary or of higher degree, selected from the group consisting of Group IV-IV elements; Group III-V elements, and Group II-VI elements.

In other preferred embodiments, (a) the substrate includes Si and the buffer structure includes a SiGe buffer layer having a Ge concentration that increases with thickness and a relaxed SiGe layer on the buffer layer; (b) the substrate includes AsGa and the buffer structure comprises a buffer layer comprising an atomic alloy of Group III-V elements of ternary or higher degree that is selected from possible (Al, Ga, In)-(N, P, As) combinations with at least two additional elements selected from the group consisting of Group III and Group V elements, wherein the two additional elements have a concentration that changes gradually with thickness of the buffer layer; (c) the donor wafer has at least one layer that includes carbon with a carbon concentration in the layer which is less than or equal to about 50%; or (d) the donor wafer has at least one layer that includes carbon with a carbon concentration in the layer which is less than or equal to about 5%.

In yet another embodiment, the method further comprises: providing a zone of weakness beneath the donor wafer surface; bonding the donor wafer surface to a surface of a receiving substrate; and detaching a useful layer from the donor wafer along the zone of weakness. If desired, before the bonding step, a bonding layer can be formed on the donor wafer surface. Also, the zone of weakness can be formed by implantation of atomic species or by porosification. The useful layer that is detached can include all or part of the buffer structure. When part is removed, and the donor wafer includes, before detachment, an overlayer located on the buffer structure, the useful layer that is detached will include at least part of the overlayer.

The invention also relates to a donor wafer produced according to one of the previously described methods. Preferably, all of the useful layer is removed so that only the substrate and the buffer structure is present. Also, the buffer structure can include a buffer layer and an additional layer, with the additional layer having a thickness which is sufficient to contain defects or having a surface lattice parameter which is substantially different from that of the substrate, and a portion of the additional layer remains on the buffer structure. This additional layer can be a protective layer in the buffer structure, an overlayer so that a portion of the overlayer remains on the buffer structure, an interlayer between the substrate and the overlayer.

It is to be understood that both the foregoing general description and the following detailed description are exemplary and are intended to provide further explanation of the invention claimed.

BRIEF DESCRIPTION OF THE DRAWINGS

Other aspects, aims and advantages of the present invention will become more clearly apparent on reading the following detailed description of implementing the preferred methods thereof, given by way of non-limiting example and made with reference to the appended drawings in which.

DETAILED DESCRIPTION OF THE PREFERRED EMBODIMENTS

Figure 1:
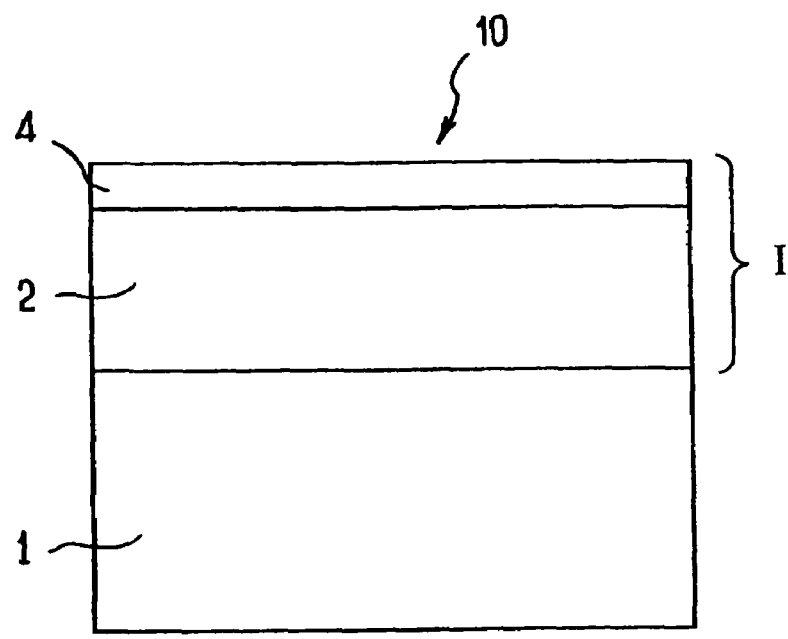
FIG. 1 shows a donor wafer according to the prior art.

The present invention provides, according to a first aspect of the invention, a method of recycling a donor wafer after detaching at least one useful semiconducting layer. The donor wafer includes a substrate, a buffer structure and, before detachment, a useful semiconducting layer. The method includes removing substance relating to part of the donor wafer on the side where the detachment took place, wherein, after the removal of the substance, at least part of the buffer structure remains that is capable of being reused as at least part of a buffer structure during a subsequent detachment of another useful layer. Thus, in accordance with the invention, it is possible to avoid completely forming a buffer layer after each recycling of the substrate.

In accordance with another aspect of the invention, method is provided further including the step of detaching at least one useful layer of producing a recyclable donor wafer.

In accordance with yet another aspect of the invention, a method for cyclically detaching a useful layer from a donor wafer is provided. Preferably, the method includes a detachment step alternating with a recycling step.

In accordance with a further aspect of the invention, a method is provided as described above wherein the useful layer may include SiGe, Si, an alloy belonging to the III-V family, the composition of which is respectively chosen from the possible (Al, Ga, In)-(N, P, As) combinations.

In accordance with another aspect of the invention, a donor wafer is provided having a useful layer by detachment according to the methods provided by the invention, wherein the original buffer structure before detachment includes an original buffer layer and an original additional layer, wherein the original additional layer has a thickness which is large enough to contain defects and/or a surface lattice parameter which is substantially different from that of the substrate; and the remaining part of the buffer structure is at least part of the original buffer structure.

The present invention is specifically directed to recycling a wafer comprising a buffer structure, after at least one useful layer has been detached from the wafer so as to integrate this useful layer into a semiconductor structure, the recycling including at least partial recovery of the buffer structure so that it can be reused in a subsequent detachment. The recycling must therefore comprise a suitable treatment which does not damage at least part of the buffer structure, thereby permitting the buffer structure to be reused in a later detachment.

As described herein, the part of the donor wafer being detached will be called the "useful layer".

The term "buffer structure", as used herein, denotes any structure behaving as a buffer layer. Advantageously, the buffer structure has a crystallographic structure which is substantially relaxed and/or without a noteworthy number of structural defects on the surface.

The term "buffer layer", as mentioned above, generally refers to a transition layer between a first crystalline structure such as a substrate and a second crystalline structure that has the primary function of modifying properties of the material, such as structural or stoichiometric properties or atomic surface recombination properties.

Advantageously, the buffer layer has at least one of two functions. The buffer layer may act to decrease the density of defects in the upper layer. The buffer layer may also act to match a lattice parameter of two crystallographic structures with different lattice parameters.

With regard to the second stated function of the buffer layer, the buffer layer is an interlayer between two structures with different lattice parameters. On one of its faces, the buffer layer has a first lattice parameter substantially identical to that of a first structure and a second lattice parameter substantially identical to that of the second structure on its other face.

As embodied herein, the buffer layers or structures described will generally comply with this "matching" buffer layer. However, the present invention is not limited to this type of buffer layer. The invention relates to any buffer layer or any buffer structure as defined in this document in the most general manner.

An example of a method according to the invention will be described below, including recycling a donor wafer of a useful layer by detachment, the donor wafer initially including a support substrate and a buffer structure.

With reference to FIG. 1, a donor wafer 10 (donor of a thin layer by detachment) as is known in the prior art includes a support substrate 1 and a buffer structure I. The application for this donor wafer 10 in the present invention is that of detaching a useful layer, from the part 4 of the buffer structure I and/or at least part of an overlayer formed on the surface of the buffer structure I (not shown in FIG. 1), in order to integrate it into a structure, such as an SOI structure.

The support substrate 1 of the donor wafer 10 includes at least one semiconductor layer having a first lattice parameter at its interface with the buffer structure I. Particularly, the support substrate 1 includes of a single semiconductor having the first lattice parameter.

In a first configuration of the buffer structure I, the buffer structure includes a buffer layer 2. The buffer layer 2, located on the support substrate 1, makes it possible to present at its surface a second lattice parameter substantially different from the first lattice parameter of the substrate 1, and thus to have, in the same donor wafer 10, two layers 1 and 4 respectively having different lattice parameters.

The buffer layer 2 may also make it possible, in some applications, for the overlying layer to prevent layer 4 from containing a high defect density and/or being subject to noticeable stresses.

Furthermore, the buffer layer 2 may make it possible, in some applications, for the overlying layer to have a good surface condition.

In general, the buffer layer 2 has a lattice parameter which changes gradually with thickness in order to establish the transition between the two lattice parameters. Such a layer is generally called a metamorphic layer. This gradual change of the lattice parameter may be produced continuously within the thickness of the buffer layer 2. Alternatively, it may be carried out in "stages", each stage being a thin layer with a substantially constant lattice parameter which is different to that of the underlying stage, so as to discretely change the lattice parameter stage by stage. The buffer layer 2 may have also have a more complex form, such as a variation in composition with a variable rate, a sign inversion of the rate or discontinuous jumps in composition.

The change of the lattice parameter in the buffer layer 2 is advantageously found by increasing therein, starting from the substrate 1, in a gradual manner, the concentration of at least one atomic element which is not contained in the substrate 1. Thus, for example, a buffer layer 2 produced on a substrate 1 made of a unitary material could be made of a binary, tertiary, quaternary or higher material. Moreover, a buffer layer 2 produced on a substrate 1 made of a binary material could be made of a tertiary, quaternary or higher material.

The buffer layer 2 is advantageously produced by growth on the support substrate 1, for example by epitaxy, using known techniques such as the Chemical Vapor Deposition ("CVD") and Molecular Beam Epitaxy ("MBE") techniques.

In general, the buffer layer 2 may be produced by any other known method, in order to obtain, for example, a buffer layer 2 consisting of an alloy of various atomic elements.

A minor step of finishing the surface of the substrate 1 underlying the buffer layer 2, for example by CMP polishing, may possibly precede the production of the buffer layer 2.

In a second configuration of the buffer structure I, and with reference to FIG. 1, the buffer structure I includes a buffer layer 2 (substantially identical to that of the first configuration) and of an additional layer 4.

The additional layer 4 may be between the substrate 1 and the buffer layer 1, or on the buffer layer 1, as shown in FIG. 1.

In a first particular case, this additional layer 4 may constitute a second buffer layer, such as a buffer layer making it possible to contain defects, and thus to improve the crystalline quality of a layer produced on the buffer structure I. This additional layer 4 is made of a semiconductor preferably having a constant material composition. The choice of the composition and of the thickness of such a buffer layer 4 to be produced are then particularly important criteria to achieve this property. Thus, for example, the structural defects in an epitaxially grown layer usually decrease gradually within the thickness of this layer.

In a second particular case, the additional layer 4 is located on the buffer layer 1 and functions as an upper layer to the buffer layer 2. Thus it may fix the second lattice parameter.

In a third particular case, the additional layer 4 is located on the buffer layer 1 and plays a role in the detachment that will be carried out in the donor wafer 10, such as a detachment at its level. The additional layer may also have several functions, such as functions chosen from these last three particular cases.

In an advantageous configuration, the additional layer 4 is located on the buffer layer 2 and has a second lattice parameter different from the first lattice parameter of the support substrate 1. Here, the additional layer 4 is made of a material relaxed by the buffer layer 2, and has the second lattice parameter. The additional layer 4 is advantageously produced by growth on the buffer layer 2, for example, by epitaxial growth by CVD or MBE.

In a first embodiment, the growth of the additional layer 4 is carried out in situ, directly in continuation with the formation of the underlying buffer layer 2, the latter also in this case being advantageously formed by layer growth.

In a second embodiment, the growth of the additional layer 4 is carried out after a minor step of finishing the surface of the underlying buffer layer 2, for example by CMP polishing, heat treatment or other smoothing techniques.

The detachment of a useful layer from the donor wafer 10 is implemented according to one of the following modes. The useful layer to be detached may be part of the additional layer 4. Alternatively, the useful layer to be detached is part of an overlayer (not shown in FIG. 1) which has been formed beforehand on the buffer structure I, for example by epitaxial growth possibly preceded by finishing the surface of the buffer structure I. The donor wafer 10 then functions as a substrate for the growth of the overlayer.

The overlayer may comprise one or more thin layers depending on the detachment mode that it is desired to use. Furthermore, the overlayer has a lattice parameter substantially identical to that of the relaxed material of the free face of the buffer structure I, such as a layer of an identical material, or another material which would have all or some of its crystallographic structure strained in tension or in compression, or the combination of these two types of material.

In a particular embodiment of the donor wafer 10, one or more interlayers are inserted between the buffer structure I and the overlayer. In this case, this or these interlayers are not removed. The useful layer to be detached is part of the additional layer 4 and an overlayer (formed in a substantially identical manner to that described in the second detachment mode).

Figure 2:
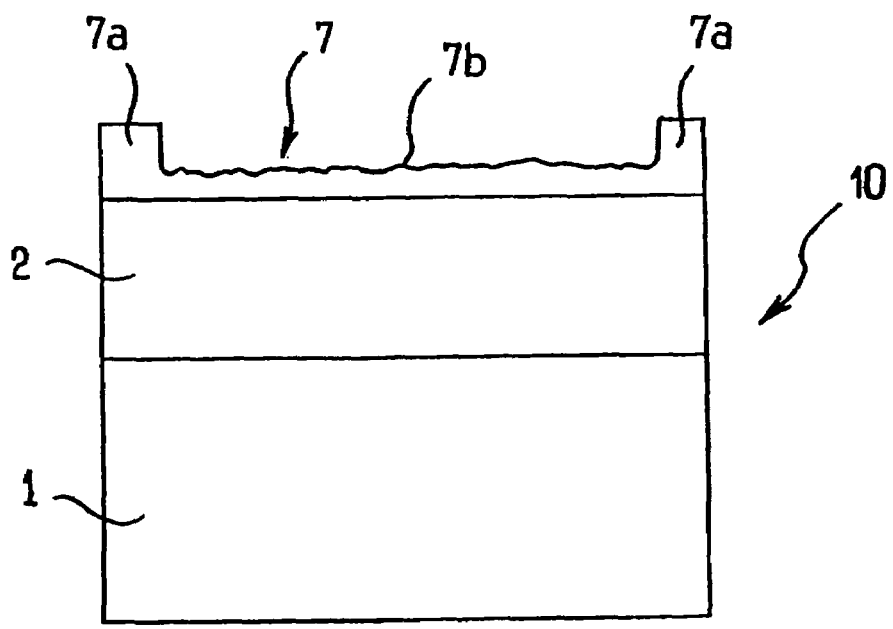
FIG. 2 shows a donor wafer after detachment.

Whatever the detachment mode chosen, and with reference to FIG. 2, after detachment and in the majority of cases, projecting parts 7a and/or rough parts 7b appear on the detachment surface of the remaining donor wafer 10. This detachment surface "in relief" belongs to a post-detachment layer 7 located above the buffer layer 2. This post-detachment layer 7 includes all or some of the layer 4, possibly one or more interlayers and possibly part of an overlayer depending on the detachment mode chosen from the three previously discussed detachment modes. The parts 7a and 7b in relief appearing on the surface of the post-detachment layer 7 mainly depend on the detachment mode and on the technique implemented during detachment.

As a first example, a detachment mode currently used in industry includes detaching the useful layer not over the entire surface of the donor wafer 10, but only over part of the latter (which is generally a substantially centred part) leaving, on the surface of the donor wafer 10, projecting parts, such as those referenced 7a. These projecting parts are generally integral and located at the periphery of the surface of the donor wafer 10, all the projecting parts then being known in the business as a "detachment ring". Other known detachment techniques exist such as the SMART-CUT® process already mentioned. These other techniques also cause surface roughness such as that referenced 7b on the detachment surface.

In accordance with the invention, once the detachment is carried out, recycling is implemented in order to restore the donor wafer 10. Recycling includes two steps. The first step is to remove substance. The second is to restore at least part of the donor wafer.

The first step of recycling according to the present invention includes removing at least the relief parts 7a and 7b, as shown in FIG. 2. This removal of substance according to the invention is implemented such that, after the removal, at least part of the buffer structure I remains, which can be used again during subsequent detachment of a new useful layer. The remaining part of the buffer structure I, after removal of substance, is thus recycled, unlike the known recycling of the prior art.

Advantageously, the removal of substance includes using means for chemically attacking the substance, such as chemical etching. The etching may be solely chemical, electrochemical, photo-electrochemical, or any other equivalent etching, such as the etching used during chemical-mechanical polishing.

Preferably, selective etching is carried out. In particular, it is possible to use an etching fluid (that is to say a gas or a solution) suitable for carrying out selective etching of a material to be removed from a material to be recycled, the two materials belonging to adjacent layers, so that the material to be recycled forms an etching stop layer, thus efficiently taking off the part to be removed while protecting the layer to be recycled from the chemical etching.

The property of selectivity between the two materials may, for example, be obtained in at least one of the following situations:
  the two materials are different;
  the two materials contain atomic elements which are substantially identical except for at least one atomic element;
  the two materials are substantially identical, but at least one atomic element in one material has an atomic concentration which is substantially different from that of the same atomic element in the other material; or
  the two materials have different porosity densities.

It is known, for example, that SiGe behaves as a stop layer when etching Si with a solution containing compounds such as KOH (potassium hydroxide, selectivity of about 1:100), $NH_4OH$ (ammonium hydroxide, selectivity of about 1:100) or TMAH (tetramethylammonium hydroxide). It is also known that when SiGe has a germanium concentration greater than or equal to 25%, it behaves as a stop layer when etching SiGe having a germanium concentration less than or equal to 20%, with a solution containing compounds such as TMAH.

Similarly, it is known that if Si is suitably doped with a doping element at a selected concentration, such as boron at more than $2 \times 10^{19}$ cm$^{-3}$, it behaves as a stop layer when etching an undoped Si material with a solution containing compounds such as EDP (ethylenediamine pyrocatechol), KOH or $N_2H_2$ (hydrazine). It is known that porous Si is etched by selective etching with respect to non-porous crystalline Si, with a solution containing compounds such as KOH or HF+$H_2O_2$. Thus, it is possible to selectively etch the additional layer 4 with respect to the buffer layer 2, and/or the possible overlayer with respect to the additional layer 4 or the possible interlayer.

This removal of substance by chemical means may also be accompanied by using mechanical means for attacking substance or other means. In particular, it is possible to carry out CMP polishing with a selective chemical etching solution. This chemical etching may also be preceded or followed by a removal of substance implemented by mechanical means of eroding substance such as polishing, grinding, abrasion or by any other means. Moreover, the removal of substance may include using any other means of attacking substance capable of removing substance without completely taking off and damaging at least part of the buffer structure I.

One of the following substance removal modes is therefore used:

(a) removing part of the post-detachment layer 7 comprising at least the relief parts 7a and 7b;

(b) removing the entire post-detachment layer 7; or (c) removing the entire post-detachment layer 7 and part of the buffer layer 2.

If the post-detachment layer 7 includes part of an original overlayer, the substance removal mode (a) then preferably includes completely taking off this overlayer part.

Figure 3:
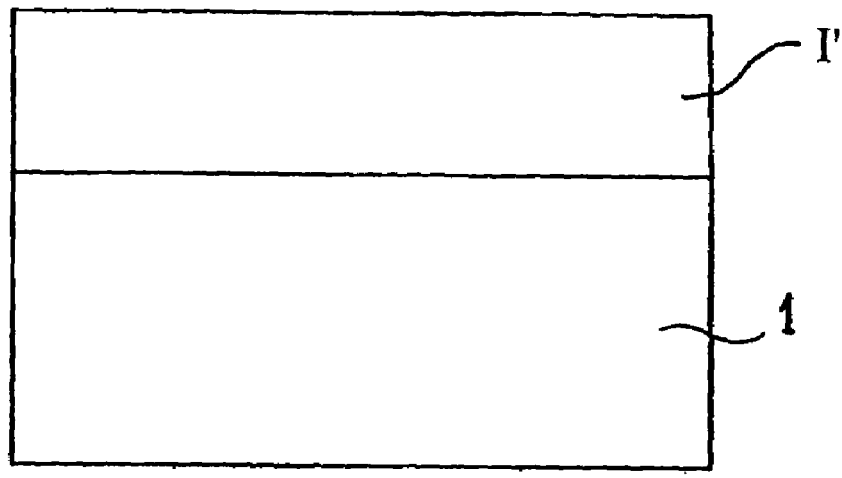
FIG. 3 shows a donor wafer after a first recycling step.

With reference to FIG. 3, the part of the original buffer structure which remains after substance removal is referenced I'. This includes the following:

the entire original buffer structure I when the substance removal mode (a) was used and when the latter did not involve taking off any part of the additional layer 4; or the buffer layer 2 and part of the additional layer 4 when the substance removal mode (a) was used and when the latter involved taking off part of the additional layer 4; or the buffer layer 2 when the substance removal mode (b) was used; or part of the buffer layer 2 when the substance removal mode (c) was used.

The second recycling step includes, after the first recycling step relating to substance removal, reforming at least some of the layers taken off during the first step.

First of all, in certain cases it will be preferred to finish the surface of the donor wafer 10 where the substance removal implemented during the first recycling step took place, so as to take off any roughness which may have appeared during the substance removal. To this end, for example CMP polishing, a heat treatment or another smoothing technique will be used.

This second recycling step involves restoring the buffer structure I from the remaining buffer structure I', when part of the original buffer structure I was removed during the first recycling step. Advantageously, the restoration of the buffer structure I is such that, once formed, the latter is substantially identical to the original buffer structure I. In a particular embodiment, it will be possible to slightly alter some production parameters in order to obtain a buffer structure I which is only slightly different from the original. For example, the concentrations of certain compounds in a material will be slightly altered.

Restoring the buffer structure I involves reforming the removed part of the buffer layer 2 when part of the original buffer layer 2 was cut away during the first recycling step. Restoring the buffer structure I also involves reforming all or part of the additional layer 4 when all or part of the original additional layer 4 was cut away during the first recycling step. Here, it will be possible to produce an additional layer 4 with a thickness substantially identical to or substantially different from the original.

Once the buffer structure I is restored, an overlayer may be formed above it. The overlayer will at least partly comprise a new useful layer to be detached, possibly with one or more interlayers between the buffer structure I and the overlayer.

The layers possibly formed during this second recycling step are advantageously produced by layer growth on their respective underlying layers, for example by CVD or MBE epitaxial growth.

In a first case, at least one of the layers formed during the second recycling step is grown in situ, directly in continuation with the formation of the underlying growth support. The underlying growth support is also formed in this case advantageously by layer growth.

In a second case, at least one of the layers formed during the second recycling step is grown after a minor step of finishing the surface of the underlying growth support, for example by CMP polishing, heat treatment or other smoothing techniques.

Thus, a donor wafer 10 which is substantially identical to the original, that is to say the donor wafer 10 shown in FIG. 1, is finally obtained, with the exception of modifications desired and carried out by a person skilled in the art.

The donor wafer 10 obtained in this way includes at least part of the original buffer structure I, and therefore at least part of the original buffer layer 2, which makes it possible to avoid its complete, lengthy and expensive reformation, as was the case in the known recycling methods.

Donor wafers 10, which can be recycled according to the particular implementational modes of the recycling methods presented above, are described further herein and provide particularly effective protection for at least part of the buffer structure I during matched recycling.

Figure 4:
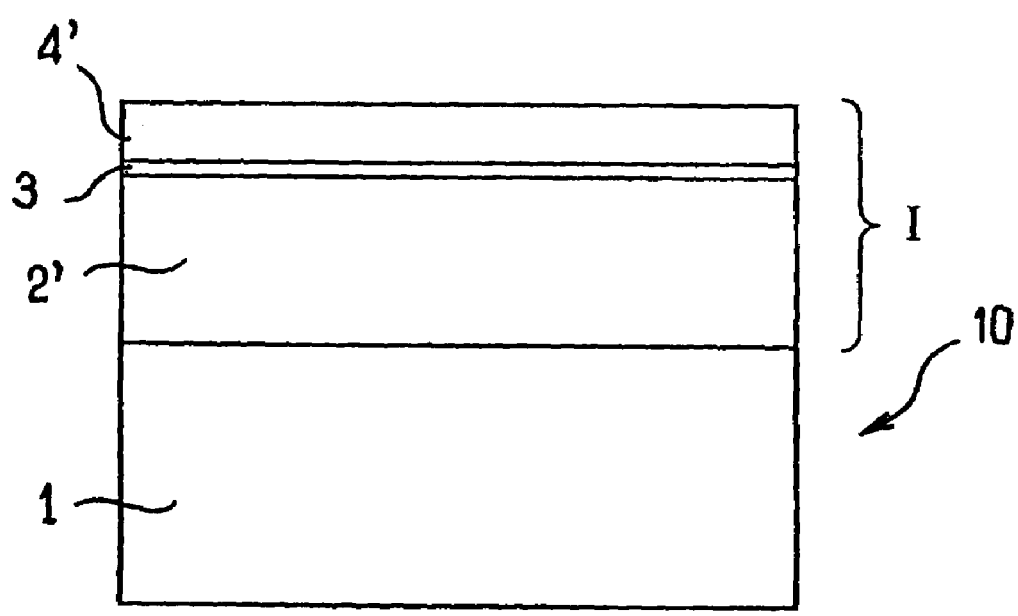
FIG. 4 shows a first donor wafer according to the present invention.
Figure 5:
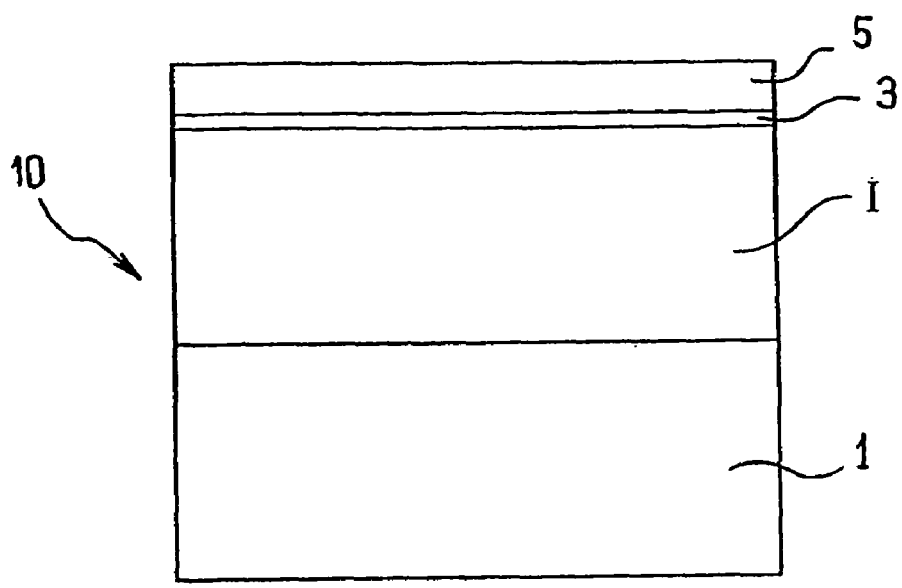
FIG. 5 shows a second donor wafer according to the present invention.
Figure 6:
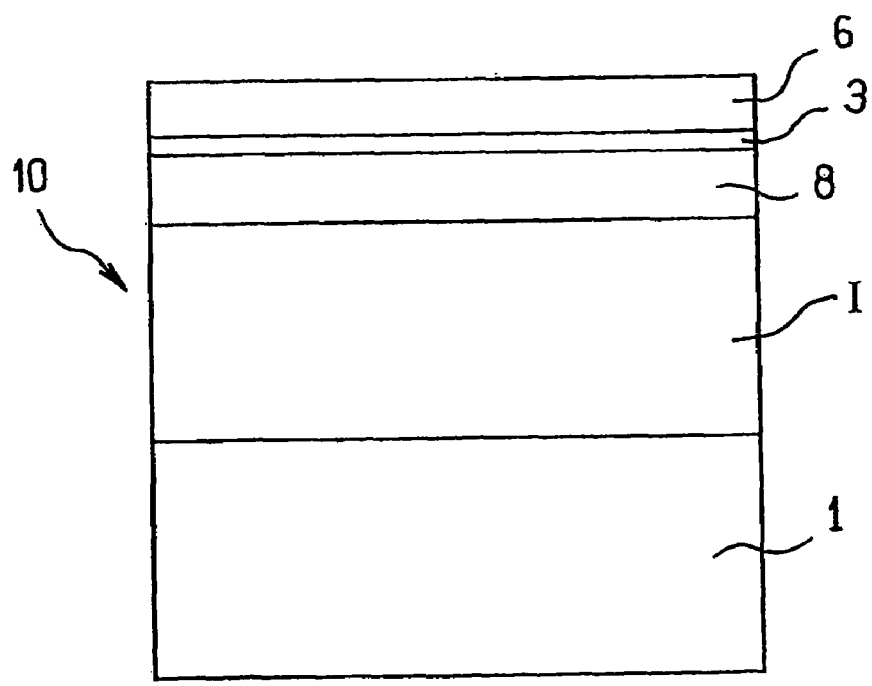
FIG. 6 shows a third donor wafer according to the present invention.

The donor wafers 10, which are shown in FIGS. 4, 5 and 6, each involve a substrate 1 and a buffer structure I, like the donor wafer 10 shown in FIG. 1.

Each of these donor wafers 10 further includes a protective layer 3 located in the part located on the same side of the buffer structure I as the interface of the latter with the substrate 1.

The protective layer 3, as defined in the present invention, is made of a material chosen from crystalline materials, such as semiconductors, so as to have the primary function of protecting the part of the donor wafer 10 which is subjacent to it, and which includes at least part of the buffer structure I, during at least one of the substance removing treatments used during the recycling.

Advantageously, the protective layer 3 is produced by layer growth on the underlying growth support, for example by CVD or MBE epitaxial growth.

In this configuration, and in a first case, the growth of the protective layer 3 is carried out in situ, directly in continuation with the formation of the layer which is subjacent to it, the latter also in this case being advantageously formed by layer growth.

In a second case, the growth of the protective layer 3 is carried out after a minor step of finishing the surface of the layer which is subjacent to it, for example by CMP polishing, heat treatment or other smoothing techniques.

The material of the protective layer 3 is chosen such that there is at least one means for removing substance having an ability to attack the material forming the protective layer 3 which is substantially different from the material of at least one of the two zones adjacent to the protective layer 3. Thus, selective substance removal may be realized.

The selective substance removal implemented at the protective layer 3 is at least one of the following selective substance removal modes:

selective removal of the material in the zone adjacent to the protective layer 3 and located on the side of the useful layer detached from the protective layer 3, the protective layer 3 forming a stop layer for substance removal; or selective removal of the material of the protective layer 3, the zone adjacent to the protective layer 3 and located on the same side of the substrate 1 as the protective layer 3 forming a layer stopping substance removal.

It is also possible, in one particular implementation of selective substance removal, to combine the successive implementation of two selective substance removal modes for the same protective layer 3.

Thus, the layer above the protective layer 3, then the protective layer 3 are selectively removed.

Whatever the selective substance removal mode chosen for implementation during the first recycling step, and intended to remove that part of the donor wafer 10 located on the side of the detached useful layer, there is a layer stopping substance removal (the protective layer 3 in the case of the first selective substance removal or the zone adjacent to the protective layer 3 located on the same side of the substrate 1 as the protective layer 3 in the case of the second selective substance removal).

Thus, the stop layer acts as a barrier to the attack of substance, and in the same way, protects the material of the part underlying the protective layer 3 (which includes at least part of the buffer structure I).

In some cases, it will be desired that the protective layer 3 does not substantially disturb the crystallographic structure of the adjacent layers, and in particular, that it does not disturb the crystalline growth of the underlying layer to be formed, the lattice parameter of which must, in most cases, substantially comply with the lattice parameter of the part underlying the protective layer 3. This is particularly important when the protective layer 3 is located in the buffer structure I (shown in FIG. 4).

Preventing the protective layer from disturbing the crystallographic structure of the adjacent layers may be achieved in accordance with several alternative embodiments of the protective layer 3.

In a first embodiment of the protective layer 3, the protective layer 3 is restricted to having its lattice parameter substantially identical to that of the zones which are adjacent to it, even if the nominal lattice parameters of these two materials are substantially different from that of the protective layer 3.

Two main conditions must therefore be met for this operation to succeed:

the respective nominal parameters of the protective layer 3 and of the zone underlying it do not have values which are too different from each other, so as to avoid the appearance of defects (such as dislocations or local strains) in the protective layer 3; and the protective layer 3 must be sufficiently thin to prevent progressive relaxation of the strain in the thickness of the layer and/or generation of defects. For this, the thickness of such a protective semiconductor layer 3, made of a strained semiconductor, must be less than a critical thickness known to a person skilled in the art, and especially depending on the materials forming it, the materials of the layers which are adjacent to it, and techniques for producing the strained layer. Critical thicknesses typically encountered are thus less than or equal to several hundred angstroms.

In a second embodiment of the protective layer 3, a material is chosen for the protective layer 3 which has a nominal lattice parameter substantially close to that of the materials forming the zones which are adjacent to it. Unlike the first embodiment, the crystallographic structure of the protective layer 3 is relaxed in this case.

To this end, and also in order to satisfy a criterion of selectivity during substance removal implemented during the first recycling step, a material will, for example, be chosen for the protective layer 3, at least one constituent element of which is different from those of the materials which are adjacent thereto, while keeping a lattice parameter close to that of the adjacent zones, this constituent element is thus the main element which will determine the selectivity with respect to the adjacent layer in question.

Preferably, no constituent element of the material of the protective layer 3 is found in the material constituting the adjacent zone involved in the selective substance removal. The two materials are thus completely different.

In another example, each different constituent element of the protective layer 3 with respect to the adjacent zone involved in the selective removal of substance may be an additional element or an element missing from the adjacent layer in question.

For example, it will be possible to dope a protective layer 3 having substantially the same lattice parameter as that of the adjacent zones so as not to substantially disturb this lattice parameter after doping.

If the protective layer 3 includes the same material as that of the zone which is adjacent thereto and involved in the selective substance removal, this doping element is the element which will then determine the selectivity ability. In the case of doping the protective layer 3, the thickness of the protective layer 3 must however, in some cases, remain less than a certain critical thickness, as is known in the art, if it is desired that defects, such as dislocations, in particular of the screw type, are not to appear.

In a third embodiment of the protective layer 3, the surface of a previously produced layer is made porous in order to form a porous layer. This porosification may be carried out by anodization, by implantation of atomic species, or by any other porosification technique, as described, for example, in document EP 0 849 788 A2, incorporated herein by reference in its entirety.

This layer of porous material may produce, when at least one adjacent material may undergo a selective substance attack determined by a suitable attack means, a protective layer 3.

This protective layer 3 is preferably between two adjacent layers, that is to say between the layer whose surface has been porosified and a layer formed on the layer of porous material, having substantially identical respective materials.

Since the porosity does not substantially disturb the crystallographic structure of these two adjacent layers, such a protective layer 3 therefore does not substantially disturb the crystallographic structure of the donor wafer 10.

Thus, a crystallographic structure is obtained for the protective layer 3 which is very close or even substantially identical to that of the zones which are adjacent thereto, the protective layer 3 therefore not disturbing the crystallography of the surrounding structure.

However, in other cases, it will be possible to have a protective layer 3 having some influence on the lattice parameter of the surrounding structures, the complete or relative strain or relaxation state that the protective layer 3 is then capable of causing to the adjacent layers shows, in these particular cases, a property considered as being of minimum benefit for the downstream application.

Several selective substance removal techniques may be implemented at the protective layer 3.

A first selective substance removal technique includes applying friction forces to the protective layer 3 in order to take off at least part of the substance to be removed. These friction forces may, for example, be applied by a polishing plate, possibly combined with abrasive action and/or chemical action.

The material which forms the protective layer 3 is chosen from semiconductors so that there is a mechanical substance abrasion method having a mechanical abrasion power which is substantially different for the material forming the protective layer 3 than for the material of at least one of the two zones adjacent to the protective layer 3, and thus being capable of implementing at least one selective mechanical abrasion method.

The selective mechanical abrasion method preferably includes selective mechanical abrasion of the material of the zone adjacent to the protective layer 3 and located on the same side as the useful layer detached from the protective layer 3.

The material of the protective layer 3 thus has properties of withstanding mechanical abrasion which are substantially greater than in the region which lies over it.

For this purpose, it is possible for example to harden the protective layer 3 with respect to the overlying layer, in a manner suitable for the mechanical abrasion method chosen to remove the overlying zone.

For example, it is known that carbonated Si, with a typical C concentration of between 5% and 50%, is harder than uncarbonated Si.

The selective mechanical abrasion method preferably includes may also include selective mechanical abrasion of the material of the protective layer 3, the zone adjacent to the protective layer 3 and located on the same side of the substrate 1 as the protective layer 3 forming an etching stop layer.

The material of the protective layer 3 has properties that help it withstand mechanical abrasion, and especially erosion, which are substantially less than in the zone which lies over it.

For example, it is possible to soften the protective layer 3 with respect to the underlying layer, in a manner suitable for the substance removal technique chosen to remove the protective layer 3.

A second selective substance removal technique includes chemically etching the substance to be removed.

Wet etching may be implemented with etching solutions suitable for the materials to be removed. Dry etching may also be implemented in order to remove substance, such as plasma etching or sputtering. Also, the etching may be solely chemical, electrochemical or photo-electrochemical.

The material which forms the protective layer 3 is chosen from the semiconductors so that there is an etching fluid (a gas or a solution) having an ability to etch the material forming the protective layer 3 which is substantially different from the material of at least one of the two zones adjacent to the protective layer 3, and thus being capable of carrying out at least one selective etching method.

The selective etching method is one of the following etching methods:

selective etching of the material of the zone adjacent to the protective layer 3 and located on the same side as the useful layer detached from the protective layer 3, the protective layer 3 forming an etching stop layer;

selective etching of the material of the protective layer 3, the zone adjacent to the protective layer 3 and located on the same side of the substrate 1 as the protective layer 3 forming an etching stop layer.

Whatever the selective etching method likely to be implemented during the recycling and intended to remove that part of the donor wafer 10 located on the same side of the detached useful layer, there is an etching stop layer (the protective layer 3 in the case of the first etching method or the zone adjacent to the protective layer 3 located on the same side of the substrate 1 as the protective layer 3 in the case of the second selective etching method).

Thus, the stop layer acts as a barrier to chemical etching, and in the same way protects the material of the part underlying the protective layer 3 (which includes at least part of the buffer structure I).

As has already been stated above, the selectivity for removing substance between the material of the protective layer 3 and the material of the adjacent zone involved in the selective etching may be obtained by the fact that:

the two materials are different;

the two materials contain substantially identical atomic elements, except for at least one atomic element;

the two materials are substantially identical, but at least one atomic element in one material has an atomic concentration which is substantially different from that of the same atomic element in the other material; or the two materials have different porosity densities.

With reference to FIG. 4, the protective layer 3 is within the buffer structure I, the donor wafer 10 thus includes a structure includes the following four successive layers: the support substrate 1, a lower part 2' of the buffer structure I, the protective layer 3 and the upper part 4' of the buffer structure I.

Here, the protective layer 3 makes it possible to protect the lower part 2' of the buffer structure I.

Recycling such a donor wafer 10 according to the invention includes, during a first step, taking off all of the part located on the same side of the upper part 4' of the buffer structure I as the protective layer 3.

At the protective layer 3, the selective substance removal mode is preferably at least one of the following selective substance removal modes:

removal of the material from the zone of the part 4' adjacent to the protective layer 3, the protective layer 3 forming a layer stopping the removal of substance; or removal of material from the protective layer 3, the zone of the part 2' adjacent to the protective layer 3 forming a layer stopping the removal of substance.

Whatever the selective substance removal mode likely to be implemented during the recycling and intended to remove the part 4' adjacent to the protective layer 3, there is a layer stopping the removal of substance (the protective layer 3 in the case of the first selective substance removal mode or the zone of the part 2' adjacent to the protective layer 3, in the case of the second selective substance removal mode), thus acting as a barrier to substance abrasion or etching, and in the same way protecting the material of the lower part 2' of the buffer structure I.

So that the crystallographic structure of the buffer structure I is not substantially disturbed, this type of protective layer 3 must have its own crystallographic structure which is substantially identical to that of the zone adjacent to the buffer structure I, and must therefore be produced according to an embodiment which makes it possible to obtain this material property, such as one of the three embodiments already discussed.

After the removal of the substance lying over the lower part 2' of the buffer structure I, the recycling advantageously includes production of a new upper part 4' of the buffer structure I, and possibly of a new protective layer 3 where the latter has been removed (during the second selective substance removal mode mentioned above or by a treatment suitable for removing this layer 3).

These layers 3 and 4' may be grown in situ or after a minor step of finishing the surface of the donor wafer 10 on which the growth(s) will take place, for example by CMP polishing, heat treatment or other smoothing techniques.

The lower part 2' of the buffer structure I is therefore preserved during recycling, which is not the case with the methods of the prior art.

In a particular and advantageous configuration of the donor wafer 10, the lower part 2' of the buffer structure I is a buffer layer, and the upper part 4' of the buffer structure I is an additional layer to the buffer layer, such as the buffer layer 2 and additional layer 4 shown in FIG. 1 and discussed above.

This particular configuration has the advantage of protecting the buffer layer 2', that is to say, that part of the buffer structure I which is generally the most difficult, the longest and the most expensive to produce.

Since the additional layer 4' is usually formed by epitaxial growth, combined with fixed parameters (such as for example the concentration of the elements to be epitaxially grown, the temperature, the pressure, the atmosphere, the growth speed and rate, etc.), and is itself the subject of detachment during the step of detaching the layer from the donor wafer 10, protecting this additional layer 4' by the protective layer 3 during recycling does not seem necessary.

However, in another particular configuration of the donor wafer 10, the protective layer 3 can be located within the additional layer 4' in order to protect at least part thereof.

And in another particular configuration, the protective layer 3 is formed inside the buffer layer 2' in order to protect only part thereof, for example the part which is most difficult to produce.

With reference to FIG. 5, a second donor wafer 10 according to the invention differs mainly from the donor wafer 10 shown in FIG. 2 in that the protective layer 3 is no longer located in the buffer structure I, but directly over the buffer structure I.

Furthermore, an overlayer 5 is present on the protective layer 3, in which at least part of a useful layer will be detached on transfer of a layer from the donor wafer 10.

The composition and the crystallographic structure of this overlayer 5 will be chosen depending on the physical, electrical and/or mechanical properties that it is desired to obtain in the post-transfer structure.

The material of this overlayer 5 may, for example, have a nominal lattice parameter substantially identical to that of the buffer structure I in its part adjacent to the protective layer 3, so as to preserve a substantially relaxed structure.

The material of this overlayer 5 may also have, for example, a nominal lattice parameter substantially different from that of the buffer structure I in its part adjacent to the protective layer 3, and have a thickness which is sufficiently small so that it has to preserve the lattice parameter of the buffer structure I in its part adjacent to the protective layer 3, and thus be strained.

The material of this overlayer 5 may again be chosen, for example, in order to have a structure intermediate between a strained structure and a relaxed structure.

In an advantageous configuration, the overlayer 5 is produced by layer growth, for example by CVD or MBE epitaxial growth.

In this configuration, and in a first case, the growth of the overlayer 5 is carried out in situ, directly in continuation with the formation of the upper part of the buffer structure I, the latter in this case also being advantageously formed by layer growth.

In a second case, the growth of the overlayer 5 is carried out after a minor step of finishing the surface of the upper surface of the underlying buffer structure I, for example by CMP polishing, heat treatment or other smoothing techniques.

With regard to the protective layer 3, its role in this case is to protect substantially all of the underlying buffer structure I and the substrate 1 from the substance removal implemented during the first recycling step.

The recycling of such a donor wafer 10, after a useful layer has been detached from it in the overlayer 5, includes, during a first step, taking off substantially all of the part located on the same side of the overlayer 5 as the protective layer 3.

At the protective layer 3, the selective substance removal mode is at least one of the following selective substance removal modes:

removal of the material of the overlayer 5 adjacent to the protective layer 3, the protective layer 3 forming a layer stopping the removal of substance; and/or removal of material of the protective layer 3, the zone of the buffer structure I adjacent to the protective layer 3 forming a layer stopping the removal of substance.

Whatever the selective substance removal mode likely to be implemented during recycling and intended to remove the remaining overlayer 5, there is a layer stopping the removal of substance (the protective layer 3 in the case of the first selective substance removal mode or the zone of the upper part of the buffer structure I, adjacent to the protective layer 3, in the case of the second selective substance removal mode), thus acting as a barrier to substance etching or abrasion, and in the same way protecting the material of the buffer structure I.

Furthermore, if may be advantageous that the protective layer 3 does not substantially disturb the crystallographic structure of the directly underlying buffer structure I, and does not disturb the crystalline growth of the overlying overlayer 5, in order to preserve the influence of the structure of the buffer structure I on the structure of the overlayer 5 being grown, and is therefore advantageously produced according to one of the three embodiments already discussed.

After the said removal of the substance overlying the buffer structure I, the recycling advantageously includes producing a new overlayer 5, and possibly a new protective layer 3 in the case where the latter has been removed (during the second selective substance removal mode mentioned above or by a treatment suitable for removing this layer 3).

These layers 5 and 3 may be grown in situ or after a minor step of finishing the surface of the donor wafer 10 on which the growth(s) will take place, for example by CMP polishing, heat treatment or other smoothing techniques.

With reference to FIG. 6, a third donor wafer 10 according to the invention differs mainly from the donor wafer 10 shown in FIG. 3 by the fact that there is an interlayer 8 between the buffer structure I and the protective layer 3.

The composition and the crystallographic structure of this interlayer 8 will be chosen as a function of the physical, electrical and/or mechanical properties that it is desired to obtain.

The material of the interlayer 8 may, for example, have a nominal lattice parameter which is substantially identical to that of the buffer structure I in its part adjacent to its interface, so as to preserve a substantially relaxed structure. In this case, the interlayer 8 is an extension of the buffer structure I, which may for example further reinforce the crystallographic rigidity of the growth surface of the overlayer 5.

The material of this interlayer 8 may also have, for example, a nominal lattice parameter which is substantially different from that of the buffer structure I in the part adjacent to its interface, and have a thickness which is low enough to have to preserve the lattice parameter of the buffer structure I in its part adjacent to the protective layer 3, and thus be strained.

In an advantageous configuration, the interlayer 8 or the overlayer 5 is produced by layer growth, for example by CVD or MBE epitaxy.

In this configuration, and in a first case, the growth of the layer in question is carried out in situ, directly in continuation with the formation of the underlying layer, the latter in this case also advantageously being formed by layer growth.

In a second case, the growth of the layer in question is carried out after a minor step of finishing the surface of the upper surface of the underlying layer, for example, by CMP polishing, heat treatment or other smoothing techniques.

With regard to the protective layer 3, its role in this case is to protect virtually the entire underlying interlayer 8, the entire buffer structure I and the substrate 1 from the substance removal implemented during the first recycling step.

At the protective layer 3, the selective substance removal mode is at least one of the following selective substance removal modes:
  removal of the material of the overlayer 5 adjacent to the protective layer 3, the protective layer 3 forming a layer stopping the removal of substance; and/or
  removal of the material of the protective layer 3, the zone of the interlayer 8 adjacent to the protective layer 3 forming a layer stopping the removal of substance.

Whatever the selective substance removal mode likely to be implemented during the recycling and intended to remove the remaining overlayer 5, there is a layer stopping the removal of substance (the protective layer 3 in the case of the first selective substance removal mode or the zone of the interlayer 8 adjacent to the protective layer 3, in the case of the second selective substance removal mode), thus acting as a barrier to substance etching or abrasion, and in the same way protecting the material of the buffer structure I.

Furthermore, it may be advantageous that the protective layer 3 does not substantially disturb the crystallographic structure of the directly underlying interlayer 8, and does not disturb the crystalline growth of the overlying overlayer 5, in order to preserve the influence of the structure of the interlayer 8 on the structure of the overlayer 5 being grown, and must therefore be produced according to one of the two embodiments already discussed.

After the said removal of the substance overlying the interlayer 8, the recycling advantageously includes producing a new overlayer 5, and possibly a new protective layer 3 in the case where the latter has been removed (during the second selective substance removal mode mentioned above or by a treatment suitable for removing this layer 3).

These layers 5 and 3 may be grown in situ or after a minor step of finishing the surface of the donor wafer 10 on which the growth(s) will take place, for example, by CMP polishing, heat treatment or other smoothing techniques.

Figure 7A:
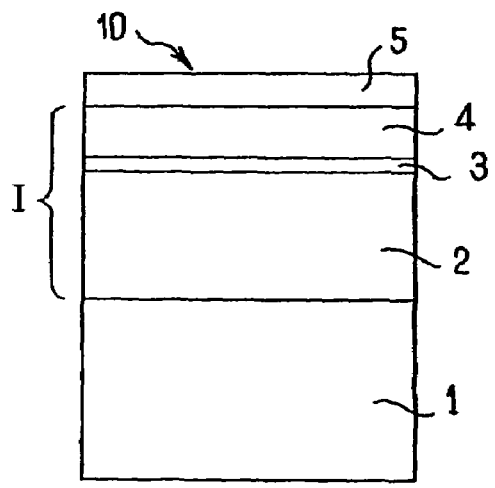
FIGS. 7a to 7f illustrate the various steps of a method according to the invention successively comprising detachment of a thin layer from a donor wafer and recycling of the donor wafer after detachment.

With reference to FIGS. 7a to 7f, the various steps are shown of a method of detaching a thin layer from and of recycling a donor wafer 10 comprising a protective layer 3, which uses a donor wafer 10 with a layer structure substantially identical to that described above with reference to FIG. 4 and which therefore includes, with reference to FIG. 7a, a substrate 1, and a buffer structure I within which there is a protective layer 3.

In the example which we will study, the protective layer 3 detaches a buffer layer 2 and an additional layer 4 in the buffer structure I.

In this exemplary method according to the invention, an overlayer 5 has been added above the additional layer 4.

The removal that will be carried out during this method will relate to detaching part of the additional layer 4 and of the overlayer 5.

In the same way and in other structural configurations of the donor wafer 10, there may be several overlayers and the detachment would then relate to the overlayers and possibly part of the additional layer 4, or there may be no overlayer and the detachment would then relate to only part of the additional layer 4.

Furthermore, it is often necessary to have a fairly thin protective layer 3: as already explained above, too thick a protective layer 3 could influence the crystalline properties of the buffer structure I, such as generating defects, for example dislocations, or changes in the lattice parameters.

For this, the thickness of the protective layer 3 must be less than a critical thickness beyond which the undesirable effects would be obtained in this case.

These four layers 2, 3, 4 and 5 have advantageously been formed by epitaxial growth according to known techniques, for example by CVD and MBE.

In a first case, at least one of these four layers is grown in situ, directly in continuation with the formation of the underlying growth support, the latter also being in this case advantageously formed by layer growth.

In a second case, at least one of these four layers is grown after a minor step of finishing the surface of the underlying growth support, for example by CMP polishing, heat treatment or other smoothing techniques.

Figure 7B:
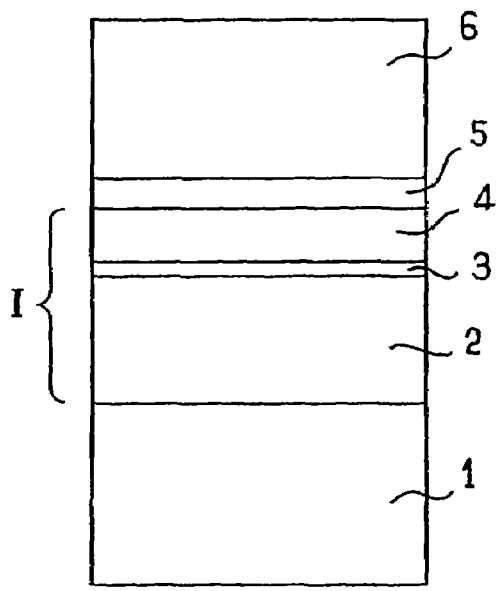
Figure 7C:
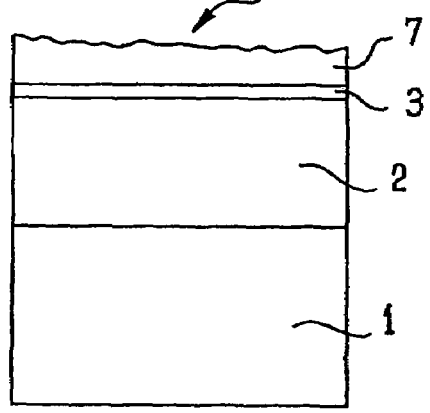

A method of detaching a thin layer is shown in FIGS. 7b and 7c.

A first preferred detachment step of the invention includes creating a cleavage zone in the additional layer 4, in order to carry out a subsequent detachment, and thus detach the desired layer(s).

Several techniques that can be implemented to create such a cleavage zone are presented here:

A first technique, called the SMART-CUT® process, known to a person skilled in the art (and descriptions of which may be found in a number of works covering techniques for reducing wafers) includes, in its first step, implanting atomic species (such as hydrogen ions) with a particular energy in order to create in this way a cleavage zone.

A second technique includes forming a fragile interface by creating at least one porous layer, as described for example in document EP-A-0 849 788, incorporated herein by reference in its entirety.

The cleavage zone advantageously formed according to one of these two techniques is, in this exemplary method according to the invention, created between the overlayer 5 and the additional layer 4 or in the additional layer 4.

Where the overlayer 5 is thick enough, the cleavage zone may be formed therein. In particular, this is the case where the overlayer 5 includes a stack of layers.

With reference to FIG. 7b, a second step relating to detaching a thin layer includes attaching a receiving substrate 6 to the surface of the overlayer 5.

The receiving substrate 6 forms a mechanical support which is rigid enough to support the overlayer 5 which will be detached from the donor wafer 10, and to protect it from any mechanical strains coming from the outside.

This receiving substrate 6 may, for example, be made of silicon or of quartz or of another type of material.

The receiving substrate 6 is attached by placing it in intimate contact with the overlayer 5 and by bonding it thereon, in which molecular adhesion is advantageously carried out between the substrate 6 and the overlayer 5.

This bonding technique, together with variants, is in particular described in the document entitled "Semiconductor Wafer Bonding" (Science and technology, Interscience Technology) by Q. Y. Tong, U. Gösele and Wiley, incorporated by reference herein in its entirety.

If necessary, the bonding is accompanied by a suitable pretreatment of the respective surfaces to be bonded and/or by a supply of heat energy and/or a supply of an additional binder.

Thus, for example, heat treatment applied during or just after the bonding makes it possible to stiffen the bonded connections.

The bonding may also be controlled by a bonding layer, such as silica, inserted between the overlayer 5 and receiving substrate 6, having particularly high molecular bonding abilities.

Advantageously, the material forming the bonding face of the receiving substrate 6 and/or the material of the bonding layer possibly formed, is electrically insulating, in order to produce an SOI structure from the detached layers the semiconductor layer of the SOI structure then being the overlayer 5 transferred with or without part of the additional layer 4.

Once the receiving substrate 6 is bonded, part of the donor wafer 10 is detached at the cleavage zone formed beforehand, by detaching it.

In the case of the said first technique (the SMART-CUT® process), in a second step, the implanted zone (forming the cleavage zone) is subjected to a heat and/or mechanical treatment, or other supply of energy, in order to detach it at the cleavage zone.

In the case of the said second technique, the fragile layer is subjected to mechanical treatment or other supply of energy, in order to detach it at the fragile layer.

Detachment at a cleavage zone according to one of these two techniques makes it possible to take off most of the wafer 10, in order to obtain a structure comprising possibly the rest of the buffer structure I, the overlayer 5, any bonding layer and the receiving substrate 6.

A step of finishing the surface of the structure formed, at the detached layer, is then advantageously implemented in order to take off any surface roughness, inhomogeneities in thickness and/or undesirable layers, by using, for example, chemical-mechanical polishing CMP, etching or at least a heat treatment.

A post-detachment layer 7 forms the part, after detachment, which remains above the protective layer 3, the entire wafer forming a donor wafer 10' to be sent for recycling in order to be reused subsequently during another layer detachment.

Figure 7D:
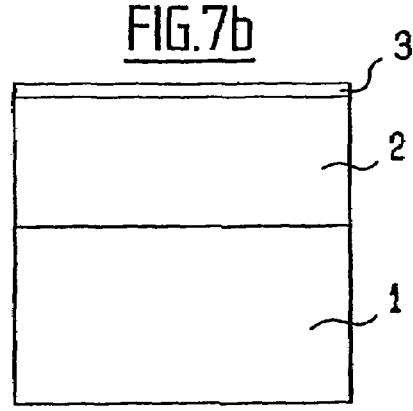
Figure 7E:
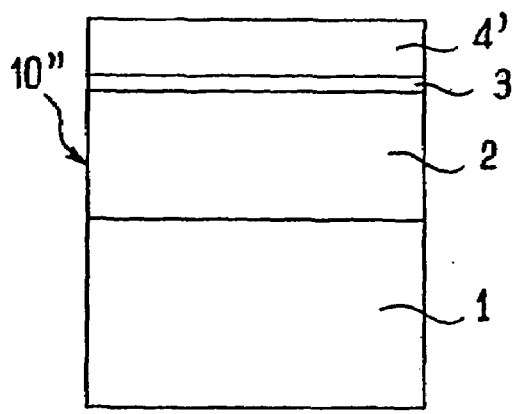
Figure 7F:
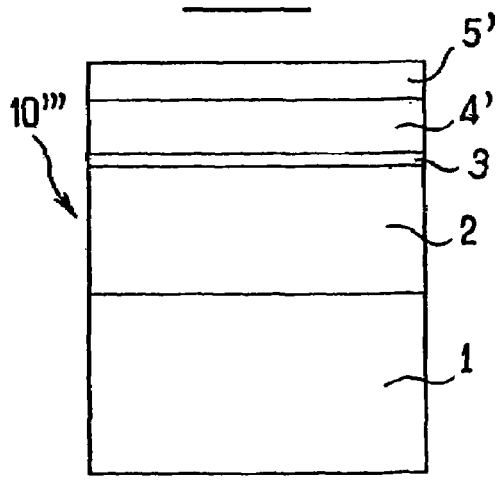

The recycling steps are shown in FIGS. 7d, 7e and 7f.

With reference to FIG. 7d, a first recycling step corresponds to removing virtually all the post-detachment layer 7 and possibly removing the protective layer 3.

Mechanical or chemical-mechanical abrasion or a suitable treatment may possibly and first of all be implemented in order to remove part of the rest of the additional layer 4 of the post-detachment layer 7, such as abrasion by grinding, polishing, CMP, chemical etching, heat treatment and smoothing.

It is also possible for several of these material etching or abrasion techniques to be combined or to follow one another, such as for example a succession of abrasions by chemical etching and by CMP.

In all cases, the first recycling step includes using at least one of the selective substance removal modes discussed above.

With reference to FIGS. 7e and 7f, a second recycling step corresponds to the restoration of layers which are substantially identical to those which existed before detachment, with the respective formations of an additional layer 4' and of an overlayer 5'.

Furthermore, the restoration includes the formation of a protective layer 3 where the latter was removed.

The layers are advantageously restored by forming a layer according to a technique which is substantially identical to one of these detailed above.

The layers 4' and 5' obtained of the donor wafer 10''' are not necessarily identical to the layers 4 and 5 of the donor wafer 10, it being possible for the donor wafer shown in FIG. 7d to act as a substrate for other types of layers.

In the exemplary method according the invention which has just been detailed, the detachment relates to part of the additional layer 4 and the overlayer 5.

In parallel, this example may be applied to a detachment concerning only part of the additional layer 4 (the donor wafer 10 not having an overlayer 5).

In parallel, this example may be applied to a detachment concerning only part of the overlayer 5, and the recycling then includes removing the remaining part of the overlayer 5.

In the exemplary method according to the invention which has just been detailed, the protective layer 3 is located between the buffer layer 2 and additional layer 4.

Obviously, this example is applicable also to cases where the protective layer 3 is located in the buffer layer 2 or in the additional layer 4.

In general, this example extends to the case where the protective layer 3 is located in the buffer structure I.

The description of the method according to the invention with reference to FIGS. 7a to 7f using a donor wafer 10 shown in FIG. 2 can also be easily transposed to donor wafers 10 shown in:

FIG. 5 by locating the protective layer 3 between the buffer structure I and the overlayer 5 instead of placing it within the buffer structure I, the layer then being detached at the overlayer 5, the detachment of the substance for recycling ending in selective etching of the overlayer 5 with respect to the protective layer 3 and/or in selective etching of the protective layer 3 with respect to the buffer structure I;

FIG. 6 by adding an interlayer 8 to the donor wafer 10 by locating it between the buffer structure I and the protective layer 3, the layer being detached at the overlayer 5, the removal of substance for recycling ending in selective etching of the overlayer 5 with respect to the protective layer 3 and/or in selective etching of the protective layer 3 with respect to the interlayer 8.

After recycling the donor wafer 10 according to the invention, a method of detaching a useful layer can then be implemented again.

Thus, in an advantageous context of the invention, a cyclic method of detaching a useful layer from a donor wafer 10 according to the invention is implemented, by making the following succeed each other repeatedly:

a detachment mode; and a recycling method according to the invention.

Before implementing the cyclic detachment method, it is possible to implement a method of producing the donor wafer 10 according to the invention with one or more of the techniques for producing thin layers on a substrate, described above.

In the remainder of this document, we present examples of configurations of donor wafers 10 comprising buffer structures I, and capable of being implemented by a method according to the invention.

In particular, we will present materials which can advantageously be used in such donor wafers.

As we have seen, a buffer structure I produced on a substrate 1 having a first lattice parameter has, most of the time, the prime function of having a second lattice parameter on its free face.

Such a buffer structure I then includes a buffer layer 2 making it possible to produce such matching of a lattice parameter.

The technique most often employed to obtain a buffer layer 2 having this property is to have a buffer layer 2 includes several atomic elements comprising:

at least one atomic element which is in the composition of the substrate 1; and at least one atomic element, none or very little of which is in the substrate 1, having a concentration changing gradually within the thickness of the buffer layer 2.

The gradual concentration of this element in the buffer layer 2 will be the main cause of the gradual change of the lattice parameter in the buffer layer 2, in a metamorphic manner.

Thus, in this configuration, a buffer layer 2 will mainly be an alloy. The atomic elements chosen for the composition of the substrate 1 and for the buffer layer 2 may be of a Group IV element, such as Si or Ge.

For example, in this case, it is possible to have a substrate 1 made of Si and a buffer layer 2 made of SiGe with a Ge concentration changing progressively with thickness between a value close to 0 at the interface with the substrate 1 and a particular value on the other face of the buffer layer 2.

In another scenario, the composition of the substrate 1 and of the buffer layer 2 may comprise pairs of atomic elements of Groups III-V, such as the possible (Al,Ga,In)-(N,P,As) combinations.

For example, in this case, it is possible to have a substrate 1 made of AsGa and a buffer layer 2 comprising As and/or Ga with at least one other element, the latter element changing progressively with thickness between a value close to 0 at the interface with the substrate 1 and a particular value on the other face of the buffer layer 2.

The composition of the substrate 1 and of the buffer layer 2 may comprise pairs of atomic elements of Groups II-VI, such as the possible (Zn,Cd)-(S,Se,Te) combinations.

EXAMPLES

The following examples of various configurations are now provided.

The first three examples particularly relate to donor wafers 10 comprising a substrate 1 made of Si and a buffer layer 2 made of SiGe and other layers of Si and of SiGe.

These wafers 10 are particularly useful in the case of detaching layers of strained SiGe and/or Si to produce SGOI, SOI or Si/SGOI structures.

In this context, the type of etching solutions used differ depending on the material (Si or SiGe) to be etched. Thus, etching solutions capable of etching these materials will be classed into categories, by attributing an identifier included in the following list to each category:

S1: selective etching solutions for Si with respect to SiGe such as a solution comprising at least one of the following compounds: KOH, $NH_4OH$ (ammonium hydroxide), TMAH, EDP or $HNO_3$ or solutions currently being studied combining agents such as $HNO_3$, $HNO_2H_2O_2$, HF, $H_2SO_4$, $H_2SO_2$, $CH_3COOH$, $H_2O_2$ and $H_2O$, as explained in document WO 99/53539, page 9.

S2: selective etching solutions for SiGe with respect to Si such as a solution comprising $HF:H_2O_2:CH_3COOH$ (selectivity of about 1:1000) or HNA (hydrofluoric-nitric-acetic solution).

Sc1: selective etching solutions for SiGe having a Ge concentration substantially less than or equal to 20% with respect to SiGe having a Ge concentration approximately equal to or greater than 25%, such as a solution comprising TMAH or KOH.

Sd1: selective etching solutions for undoped Si with respect to Si doped with boron, preferably at more than $2 \times 10^{19}$ $cm^{-3}$, such as a solution comprising EDP (ethylenediamine pyrocatechol), KOH or $N_2H_2$ (hydrazine).

Example 1

After recycling, the donor wafer 10 includes:

a substrate 1 made of Si;

a buffer structure I made of SiGe with a buffer layer 2 and an additional layer 4;

a post-detachment layer 7 made of Si or of SiGe which forms the rest of an overlayer 5 after detaching part of the latter.

The buffer layer 2 preferably has a Ge concentration progressively increasing from the interface with the substrate 1, in order to make the SiGe lattice parameter change as explained above.

The thickness is typically between 1 and 3 micrometers in order to obtain good structural relaxation at the surface, and to contain the defects associated with the difference in lattice parameter so that they are buried.

The additional layer 4 is made of SiGe substantially relaxed by the buffer layer 2, with a Ge concentration which is advantageously uniform and substantially equal to that of the buffer layer 2 near their interface.

The concentration of germanium in the silicon within the relaxed SiGe layer 4 is typically between 15% and 30%.

This limitation at 30% represents a typical limitation of the current techniques, but may be made to change in the next few years.

The additional layer 4 has a thickness which may vary hugely depending on the case, with a typical thickness of between 0.5 and 1 micron.

In the case where the post-detachment layer 7 is made of Si, selective etching of the latter with respect to the additional layer 4 made of SiGe may advantageously be implemented, with an S1-type etching solution, in order to take it off.

In the case where the post-detachment layer 7 is made of SiGe and where:
  the Ge concentration in the post-detachment layer 7 is substantially less than or equal to 20%, and
  the Ge concentration in the additional layer 4 is approximately equal to or greater than 25%,
selective etching of the post-detachment layer with respect to the additional SiGe layer 4 will be implemented, with an Sc1-type etching solution, in order to take it off.

In all cases, the last part of the post-detachment layer 7 is thus completely removed by chemical means, with an etching stop at the protective layer 3 which thus forms a stop layer, protecting the underlying layers that it is desired to preserve.

Example 2

After recycling, the donor wafer 10 is substantially identical to that presented in example 1, with the exception of the presence of a protective layer 3 within the wafer 10.

The protective layer 3 includes:
strained Si; or
SiGe; or
boron-doped Si.

It will be recalled that in the case where the protective layer 3 is made of strained Si, the thickness of the protective layer 3 here must not exceed a critical thickness.

Thus, for example, for a protective layer 3 made of strained Si inserted between two SiGe layers respectively having a Ge concentration substantially equal to 20%, the critical thickness is typically equal to about 20 nanometres.

In a first case, the protective layer 3 is located between two SiGe layers.

This is especially the case where the protective layer 3 is located between two layers of the buffer structure I; or between the buffer structure I and a post-detachment layer 7 made of SiGe; or in the post-detachment layer made of SiGe.

Several types of etching may thus be implemented depending on the material of the protective layer 3:
  If the protective layer 3 is made of strained Si:
    the overlying part made of SiGe is selectively etched with an S2-type solution;
  and/or:
    after having removed the post-detachment layer 7, the protective layer 3 is selectively etched with an S1-type solution.
  If the protective layer 3 is made of SiGe with a Ge concentration approximately equal to or greater than 25% and if the overlying layer has a Ge concentration substantially less than or equal to 20%:
    the overlying SiGe part is selectively etched with an Sc1-type solution.
  If the protective layer 3 is made of SiGe with a Ge concentration substantially less than or equal to 20% and if the underlying layer has a Ge concentration approximately equal to or greater than 25%:
    after having removed the post-detachment layer 7, the protective layer 3 is selectively etched with an Sc1-type solution.

In a second case, the protective layer 3 is located between an underlying SiGe layer and an overlying Si layer.

This is especially the case if the protective layer 3 is located between the buffer structure I and a post-detachment Si layer 7; or between a SiGe interlayer 8 and a post-detachment Si layer 7; or in the post-detachment layer 7 between a SiGe layer and a Si layer.

Several types of etching may then be implemented depending on the material of the protective layer 3;
  If the protective layer 3 is made of B-doped Si:
    the overlying Si part is selectively etched with an Sd1-type solution;
  If the protective layer 3 is made of SiGe:
    the overlying Si part is selectively etched with an S1-type solution.
  If the protective layer 3 is made of SiGe with a Ge concentration substantially less than or equal to 20% and if the underlying layer has a Ge concentration approximately equal to or greater than 25%:
    after having removed the post-detachment layer 7, the protective layer 3 is selectively etched with an Sc1-type solution.

In a third case, the protective layer 3 is located between two Si layers.

This is especially the case if the protective layer 3 is located between a Si interlayer and a post-detachment Si layer 7; or in the post-detachment Si layer 7.

Several types of etching may then be implemented depending on the material of the protective layer 3:
  If the protective layer 3 is made of B-doped Si:
    the overlying Si part is selectively etched with an Sd1-type solution;
  If the protective layer 3 is made of SiGe:
    the overlying Si part is selectively etched with an S1-type solution; and/or
    after having removed the post-detachment layer 7, the protective layer 3 is selectively etched with an S2-type solution.

Example 3

After recycling, the donor wafer 10 includes:
a Si substrate 1;
a buffer structure I with a SiGe buffer layer 2 and an additional Ge layer 4;
a post-detachment AsGa layer 7 which forms the rest of an overlayer 5 after detaching part of the latter;
a protective AlGaAs layer 3 placed in the post-detachment layer 7.

The buffer layer 2 preferably has a Ge concentration increasing progressively from the interface with the substrate 1, in order to make the lattice parameter change between that of the Si substrate 1 and that of the additional Ge layer 4.

To this end, in the buffer layer 2, the Ge concentration is made to progress from about 0 to about 100%, or more precisely around 98%, for complete agreement of the theoretical lattice of the two materials.

In a first scenario, the selective chemical etching of the post-detachment layer 7 with a selective etching solution, such as a solution comprising citric acid ($C_6H_8O_7$) and hydrogen peroxide having a pH between about 6 and 7 (the selectivity coefficient typically being 20), makes it possible to take off substantially all of the remaining post-detachment layer 7, the protective layer 3 behaving here like an etching stop layer.

In a second scenario, after removing part of the post-detachment layer 7 overlying the protective layer 3, and for an aluminium concentration in the protective layer 3 greater than 20%, selective chemical etching of the protective layer 3 with a selective etching solution, such as a solution comprising diluted hydrofluoric acid (between about 9% and 48%) (the selectivity coefficient typically being between 350 and 10000), makes it possible to take off virtually all of the protective layer 3, the underlying post-detachment layer 7 behaving here like an etching stop layer.

In a third scenario, it is possible to make two selective etchings succeed each other in order to remove at least part of the post-detachment layer 7 and to remove the protective layer 3.

The buffer structure I is thus preserved and is completely recycled.

Example 4

After recycling, the donor wafer 10 includes:
a substrate 1 comprising at least one AsGa part at its interface with the buffer structure I;
at least part of a buffer structure I made of a III-V material;
a post-detachment layer 7 comprising a III-V material which constitutes the rest of an overlayer 5 after detachment of part of the latter.

The prime benefit of this buffer structure I is to match the lattice parameter of the material of the overlayer 5 (whose nominal value is about 5.87 angstroms) to that of the AsGa (whose nominal value is about 5.65 angstroms).

In the bulk III-V materials, and by comparing bulk InP to bulk AsGa, the latter is less expensive, more widely available on the semiconductor market, less fragile mechanically, a material from which the use of technologies with contact by a rear face is better known, and whose size may reach high values (typically 6 inches instead of 4 inches for bulk InP).

All the benefits which can be offered by such a donor wafer 10 is therefore seen here: this is because it makes it possible to produce an active layer of a III-V material to be transferred with a particular quality and particular properties, which may for example be close to properties that would have been found when producing the latter material in bulk.

In a particular configuration of the donor wafer 10 before detachment, the overlayer 5 before detachment comprised InP to be detached.

Since the bulk InP has a dimension generally limited to 4 inches, the donor wafer 10 gives, for example, a solution to producing an InP layer dimensioned at 6 inches.

A buffer structure I for producing such an overlayer 5 requires a thickness typically greater than one micron, and which will be made to change towards greater thicknesses, especially if it can be recycled according to the present invention.

The epitaxial growth technique usually implemented to produce such a buffer structure I is furthermore particularly difficult and expensive, it is therefore beneficial to be able to recover it at least partially after detaching the useful layer.

Advantageously, the buffer structure I includes a buffer layer 2 having InGaAs with an In concentration changing between 0 and about 53%.

The buffer structure I may further comprise an additional layer 4 made of a III-V material, such as InGaAs or InAlAs, with a substantially constant concentration of the atomic elements.

In a particular detachment case, the InP overlayer 5 and part of the additional layer 4 will be detached in order to transfer it to a receiving substrate.

Thus it will be possible to profit from any electrical or electronic properties existing between the two detached materials. This is the case, for example, if the part of the additional layer 4 detached is made of InGaAs or of InAlAs: electronic band discontinuities between the latter material and InP create improved electronic mobilities in the detached layers.

Other configurations of the donor wafers 10 are possible, comprising other III-V compounds, such as InAlAs or the like.

Typical applications of such layer detachment are HEMT or HBT ("High-Electron Mobility Transistor" and "Heterojunction Bipolar Transistor", respectively) production.

Chemical etching solutions, which may be selective, suitable for removing some III-V materials with respect to other III-V materials will advantageously be used during the first recycling step.

Thus, for example, in order to remove an InP post-detachment layer 7 without removing an underlying InGaAs layer, selective etching of InP can be implemented with a solution comprising concentrated HCl.

Example 5

After recycling, the donor wafer 10 includes:
a substrate 1 including AsGa at its interface with the buffer structure I;
a buffer structure I including InGaAs at its interface with the post-detachment layer 7;
an InP post-detachment layer 7 which forms the rest of an overlayer 5 after detaching part of the latter;
a protective layer 3 made of $In_xGa_{1-x}As_yP_{1-y}$ placed between the post-detachment layer 7 and the buffer structure I; or in the post-detachment layer 7.

This type of donor wafer 10 (without the protective layer 3) has already been described in example 4.

In a first scenario, the selective chemical etching of the post-detachment layer 7 with a selective etching solution, such as a solution comprising HF, makes it possible to take off virtually all of the remaining post-detachment layer 7, the protective layer 3 behaving here like an etching stop layer.

In a second scenario, after removal of the part of the post-detachment layer 7 overlying the protective layer 3, the selective chemical etching of the protective layer 3 with a selective etching solution, such as a solution comprising $Ce^{IV} H_2SO_4$, makes it possible to take off virtually all of the protective layer 3, the layer underlying the protective layer 3 behaving here like an etching stop layer.

In a third scenario, it is possible to make two selective etchings succeed one another in order to remove at least part of the post-detachment layer 7 and to remove the protective layer 3.

The buffer structure I is thus preserved and is completely recycled.

Example 6

After recycling, the donor wafer 10 includes:
a substrate 1 comprising AsGa at its interface with the buffer structure I;
a buffer structure I comprising InGaAs;
an InP protective layer 3 located on or in the InGaAs.

In a first scenario, the selective chemical etching of the InGaAs overlying the protective layer 3 with a selective etching solution, such as a solution comprising $Ce^{IV} H_2SO_4$, makes it possible to take off virtually all of this material overlying the protective layer 3, the protective layer 3 behaving here like an etching stop layer.

In a second scenario, after removing the InGaAs overlying the protective layer 3, the selective chemical etching of the protective layer 3 with a selective etching solution, such as a solution comprising HF, makes it possible to take off virtually all of the protective layer 3, the InGaAs underlying the protective layer 3 behaving here like an etching stop layer.

In a third scenario, it is possible for two selective etchings to succeed one another in order to remove part of the InGaAs and to remove the protective layer 3.

In the semiconductor layers presented in this document, other components may be added to them, such as carbon with a carbon concentration substantially less than or equal to 50% or more particularly with a concentration less than or equal to 5% in the layer in question.

Finally, the present invention is not limited to a buffer structure I, an intermediate layer 8 or an overlayer 5 made of materials presented in the examples above, but extends also to other alloys of Groups IV-IV, III-V, or II-VI.

It should be specified that these alloys may be binary, ternary, quaternary or of a higher degree.

The present invention is not limited either to a recyclable buffer layer 2 or buffer structure I having the prime function of matching the lattice parameter between two adjacent structures with different respective lattice parameters, but also relates to any buffer layer 2 or buffer structure I as defined in the most general manner in the present document and which can be recycled according to the invention.

The structures finally obtained after detachment are not limited either to SGOI, SOI, Si/SGOI structures, or to structures for HEMT and HBT transistors.

As can be seen, the present invention, as described above and shown in the drawings, provides for a more economical method for recycling a wafer than with prior art techniques.

It will be apparent to those skilled in the art that various modifications and variations can be made in the present invention without departing from the spirit or scope of the invention. Thus, it is intended that the present invention include all such modifications and variations within the scope of the appended claims and their equivalents.

What is claimed is:

1. A donor wafer having supplied a useful layer by detachment and capable of being recycled comprising:
   a substrate;
   a buffer structure on the substrate;
   a protective layer associated with the buffer structure;
   a post detachment layer located above the buffer structure and presenting projections or rough portions on its surface;
   whereas the protective layer prevents removal of the entire buffer structure when the post detachment layer is removed.

2. The donor wafer of claim 1, wherein the protective layer is located between the buffer structure and the post detachment layer and prevents removal of any of the buffer structure when the post detachment layer is removed.

3. The donor wafer of claim 2, wherein the protective layer is made of a material that is sufficiently different from the material of the buffer layer so that the protective layer can be selectively removed with the post detachment layer removal of any of the buffer structure.

4. The donor wafer of claim 1, wherein the protective layer is located in the buffer structure, dividing that structure into upper and lower buffer layers, with the upper buffer layer located above the protective layer and the lower buffer layer located between the substrate and the protective layer.

5. The donor wafer of claim 4, wherein the protective layer is made of a material that is sufficiently different from that of the upper buffer layer so that that layer can be removed by etching with an etchant having an etching power which does not remove the protective layer.

6. The donor wafer of claim 4, wherein the protective layer is made of a material that is sufficiently different from that of the upper buffer layer so that that layer can be removed by selective mechanical abrasion, wherein the material of the protective layer is a semiconductor and the material of the buffer layer is more easily removed mechanically than the protective layer.

7. The donor wafer of claim 4, wherein the protective layer has a lattice parameter that is substantially identical to that of the buffer layers that are adjacent to it.

8. The donor wafer of claim 4, wherein the protective layer has a thickness that is sufficiently thin to prevent progressive relaxation of strain or the generation of defects in the adjacent buffer layers.

9. The donor wafer of claim 4, wherein the protective layer is made of a material that has a nominal lattice parameter substantially close to that of the adjacent buffer layers, and the protective layer has a crystallographic structure that is relaxed.

10. The donor wafer of claim 9, wherein the materials of the protective layer and the upper buffer layer are sufficiently different to allow selective removal of one layer and not the other.

11. The donor wafer of claim 10, wherein one layer includes an additional element or is missing an element that is present in the other layer.

12. The donor wafer of claim 4, wherein the upper buffer layer is rendered porous so that it can be selectively removed.

13. The donor wafer of claim 2, wherein protective layer includes an overlayer between the protective layer and the post detachment layer.

14. The donor wafer of claim 13, wherein the overlayer has a nominal lattice parameter substantially identical to that of the adjacent buffer structure to preserve a substantially relaxed structure.

15. The donor wafer of claim 13, wherein the overlayer has a nominal lattice parameter that is substantially different from that of the adjacent buffer structure and a thickness which is sufficiently small to preserve and not relax the lattice parameter of the buffer structure.

16. The donor wafer of claim 15, wherein the overlayer includes
   (a) a material selected from the group consisting of SiGe and strained Si;
   (b) a material selected from the group consisting of AsGa and Ge; or
   (c) InP or another alloy of Group III-V elements.

17. The donor wafer of claim 13, further comprising an interlayer between the buffer structure and the overlayer.

18. The donor wafer of claim 17, wherein the interlayer includes
   (a) a material selected from the group consisting of SiGe and strained Si;
   (b) a material selected from the group consisting of AsGa and/or Ge;
   (c) an alloy of Group III-V elements; or (d) a material selected from the group consisting of InP and a Group III-V material having a lattice parameter substantially identical to that of InP.

19. The donor wafer of claim 1, wherein the buffer structure has a composition that includes an atomic alloy of binary, ternary, quaternary or of higher degree, selected from the group consisting of Group IV-IV elements; Group III-V elements, and Group II-VI elements.

20. The donor wafer of claim 1, wherein
(a) the substrate includes Si and the buffer structure includes a SiGe buffer layer having a Ge concentration that increases with thickness and a relaxed SiGe layer on the buffer layer;
(b) the substrate includes AsGa and the buffer structure comprises a buffer layer comprising an atomic alloy of Group III-V elements of ternary or higher degree that is selected from possible (Al,Ga,In)-(N,P,As) combinations with at least two additional elements selected from the group consisting of Group III and Group V elements, wherein the two additional elements have a concentration that changes gradually with thickness of the buffer layer;
(c) the donor wafer has at least one layer that includes carbon with a carbon concentration in the layer which is less than or equal to about 50%; or
(d) the donor wafer has at least one layer that includes carbon with a carbon concentration in the layer which is less than or equal to about 5%.

* * * * *